US010957651B2

(12) United States Patent
Templeton et al.

(10) Patent No.: US 10,957,651 B2
(45) Date of Patent: Mar. 23, 2021

(54) PACKAGE LEVEL POWER GATING (71) Applicant: NVIDIA Corp., Santa Clara, CA (US)

(72) Inventors: Don Templeton, San Jose, CA (US); Luke Young Chang, Hillsborough, CA (US); Narayan Kulshrestha, Fremont, CA (US)

(73) Assignee: NVIDIA Corp., Santa Clara, CA (US)

( * ) Notice: Subject to any disclaimer, the term of this patent is extended or adjusted under 35 U.S.C. 154(b) by 0 days.

(21) Appl. No.: 16/534,017

(22) Filed: Aug. 7, 2019

(65) Prior Publication Data
US 2021/0043574 A1    Feb. 11, 2021

(51) Int. Cl.
*H01L 23/538* (2006.01)
*H01L 23/50* (2006.01)
*H01L 25/065* (2006.01)

(52) U.S. Cl.
CPC .......... *H01L 23/5384* (2013.01); *H01L 23/50* (2013.01); *H01L 25/0655* (2013.01); *H05K 2201/095* (2013.01); *H05K 2201/0929* (2013.01); *H05K 2201/09781* (2013.01)

(58) Field of Classification Search
CPC ............... H01L 23/5384; H01L 23/50; H05K 2201/095–09645; H05K 2201/0929–09363
USPC ........................................................ 257/774
See application file for complete search history.

(56) References Cited

U.S. PATENT DOCUMENTS

| | | | |
|---|---|---|---|
| 5,872,403 A | 2/1999 | Bowman et al. | |
| 6,599,764 B1 | 7/2003 | Ang et al. | |
| 2002/0117751 A1 | 8/2002 | Crane, Jr. et al. | |
| 2004/0169266 A1 | 9/2004 | Maxwell | |
| 2007/0023878 A1* | 2/2007 | Burton | G06F 1/3296 257/675 |
| 2007/0245278 A1* | 10/2007 | Chen | G06F 30/33 716/109 |
| 2009/0200074 A1 | 8/2009 | Douriet et al. | |
| 2011/0114380 A1* | 5/2011 | Mok | H05K 1/0236 174/377 |
| 2014/0001651 A1 | 1/2014 | Nickerson et al. | |
| 2014/0021621 A1 | 1/2014 | Low et al. | |
| 2014/0054597 A1 | 2/2014 | Ritenour et al. | |
| 2015/0264801 A1* | 9/2015 | Martin | H05K 1/0237 361/760 |
| 2018/0374789 A1* | 12/2018 | Chang | H01L 23/49833 |
| 2019/0304915 A1* | 10/2019 | Jain | H01L 23/147 |

* cited by examiner

*Primary Examiner* — Victoria K. Hall
(74) *Attorney, Agent, or Firm* — Rowan TELS LLC (57) ABSTRACT

A die package is disclosed through which power domains within the chip may be isolated by removing vias within the package substrate, rather than power gating. Multiple substrate options may be configured without specific vias. This eliminates the need to design power gating circuitry into the die, freeing up that die area for more functional logic. The solution allows the die package to retain the same pinout for use by PCB designers, regardless of which power domains are gated.

18 Claims, 7 Drawing Sheets

PRIOR ART

PACKAGE LEVEL POWER GATING

BACKGROUND

Power gating in integrated circuits isolates sub-groups of circuits (herein, "logic blocks") of a semiconductor die (also referred to as a 'chip') from the power supply such that the entire die is not turned on at one time. This is useful to control power consumption by the die.

Power-gating techniques generally involve shutting off or reducing voltage that is supplied to certain logic blocks when those logic blocks are not in use, such as when they aren't used in the final version of the product that is sold, or when those logic blocks are in a sleep, standby, or otherwise idle mode.

Some power-gating techniques provide what is known as a power-gate transistor between the power supply pin on the die package (the interface between the die and circuits external to the die) and the logic block. The power-gate transistor may be an NMOS or PMOS transistor. The power-gate transistor operates as a switch that selectively couples the supply voltage to the logic block. A large number of power-gating transistors are typically manufactured onto the die to temporarily or permanently switch off logic blocks in order to reduce the overall leakage power of the die. However, a typical power-gate transistor is large in size, and may itself have some associated leakage current or other parasitic effects that can affect the power consumption or other efficiencies of the die.

For these reasons die-based power gating may incur around a 10% area penalty, meaning that the die circuitry expands in size by about 10% due to the inclusion of on-die power-gating transistors and associated circuitry. Leakage current and other undesirable effects may also increase somewhat when a large number of power-gating transistors are included on a die.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Techniques are disclosed to control the powering of logic blocks in different power domains on one or more dies, for example in a die package.

"Die package" refers to an electronic assembly in which multiple integrated circuits (dies) are integrated onto a unifying substrate, such that the dies may interoperate as a unified system. "Power domain" refers to a set of circuits on a die that draw power from a common power rail. "Power rail" refers to an electrical conductor within a die coupled to a power pin providing power to logic blocks within the die. "Logical isolation" refers to the design of isolation between power domains on a chip into the power domains themselves, such that if a power domain is disabled, other power domains that communicate data or signals to the disabled power domain detect this condition and continue to function without interacting with the disabled power domain. Known techniques for logical isolation involve designing power domains to operate independently without the exchange of signals or control between them.

In the disclosed techniques, vias on the package substrate that couple to power pins that supply particular power domains on the die are excluded or removed.

"Via" refers to an electrical interconnect between a power plane and the pin on a die. A via may also be used to change the routing level of a conductor routed through a package substrate. "Package substrate" refers to a mount for one or more dies, including internal wiring to carry power to the die(s), and usually also to route signals between pins of the same or a different die. "Power pin" refers to an electrical conductor on a die acting as an interface between the die and a power source.

Techniques utilizing this approach enable entire power domains in the die to be deactivated in the end product die package without the use of on-die power-gating transistors. "Pin" refers to an electrical coupling external to a die, for example to solder the die to a package substrate. "Power plane" refers to an electrically conductive layer within a package substrate that carries power to power pins of one or more dies mounted on the package substrate.

Despite being decoupled from the power planes of the underlying package substrate, the power pins of the die are retained and typically electrically joined (e.g., soldered) to the package substrate, as if the vias were present. Different substrates may then be manufactured for different die packages: some of the substrates omit particular vias. A variety of die packages may be formed by combining the specially-formed substrates with the various dies selectively, to produce final die packages having particular combinations of power domains enabled and disabled. Internally, the dies electrically coupled with the package substrate omit some or all of the power gates between their power pins and the power domains, which simplifies the signal routing with the dies and/or between the dies and the package substrate, and reduces the area of the dies. "Power gate" refers to a circuit within a die that controls the flow of power from a power rail to a power domain. Logical isolation may be provided between power domains on the dies, or the power domains may be physically isolated using for example physical isolation gates.

Figure 1:
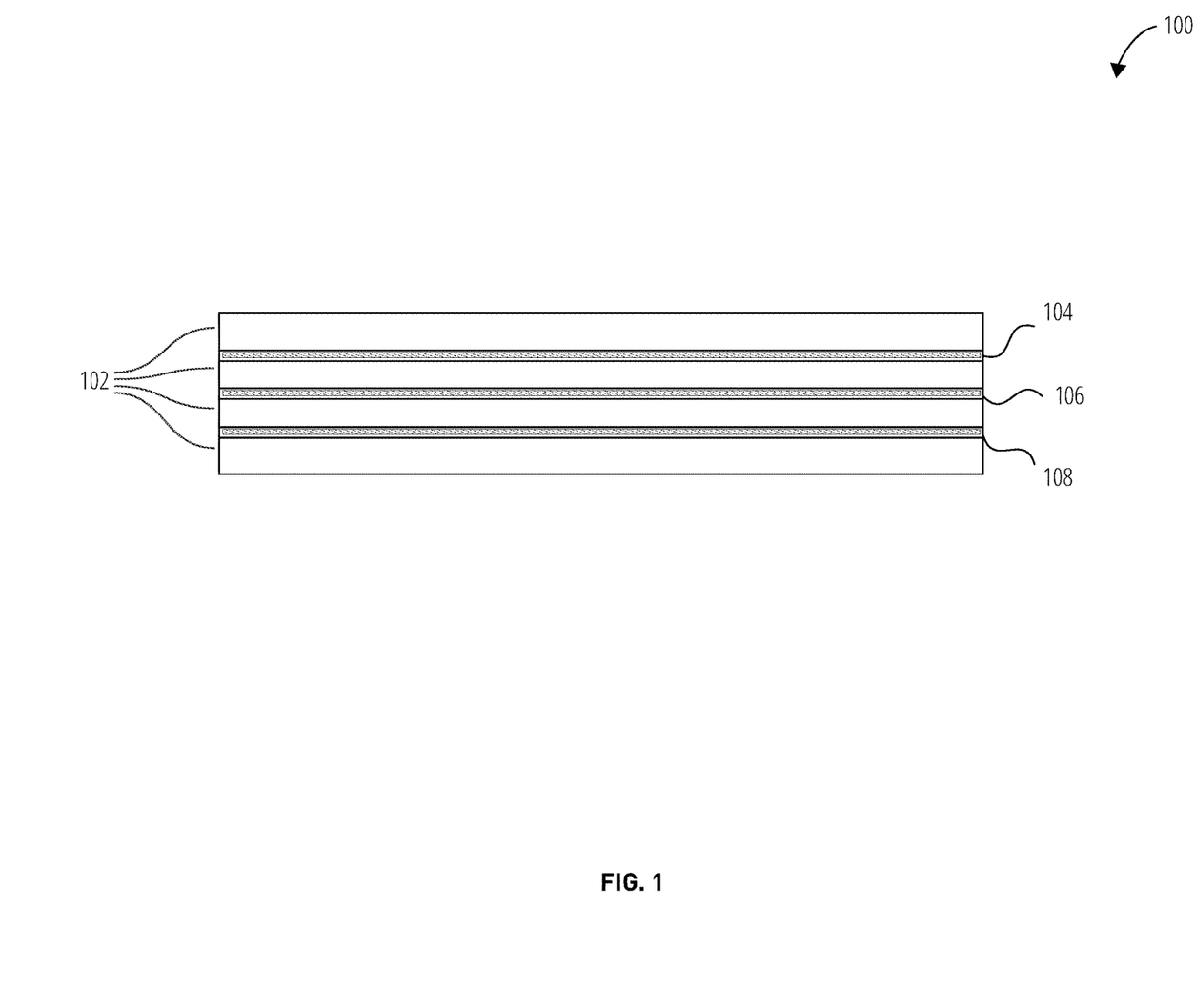
FIG. 1 illustrates a package substrate 100 in accordance with one embodiment.

FIG. 1 illustrates a package substrate 100 in accordance with one embodiment. Insulating layers 102 separate one or more metallic planes. These metallic planes in the package substrate 100 depiction are power plane 104, power plane 106, and power plane 108. In a typical semiconductor die package, the insulating layers 102 may be created from a non-conductive, temperature resistant glass or polymer material. The power planes may commonly comprise thin layers of copper or aluminum and may be used to carry signal ground as well as multiple voltage levels to supply power pins of the die forming the semiconductor die package. Alternately, a single conductive core layer may reside between two insulating layers and may be divided internally with an insulating fill to isolate the different supply voltages.

Figure 2:
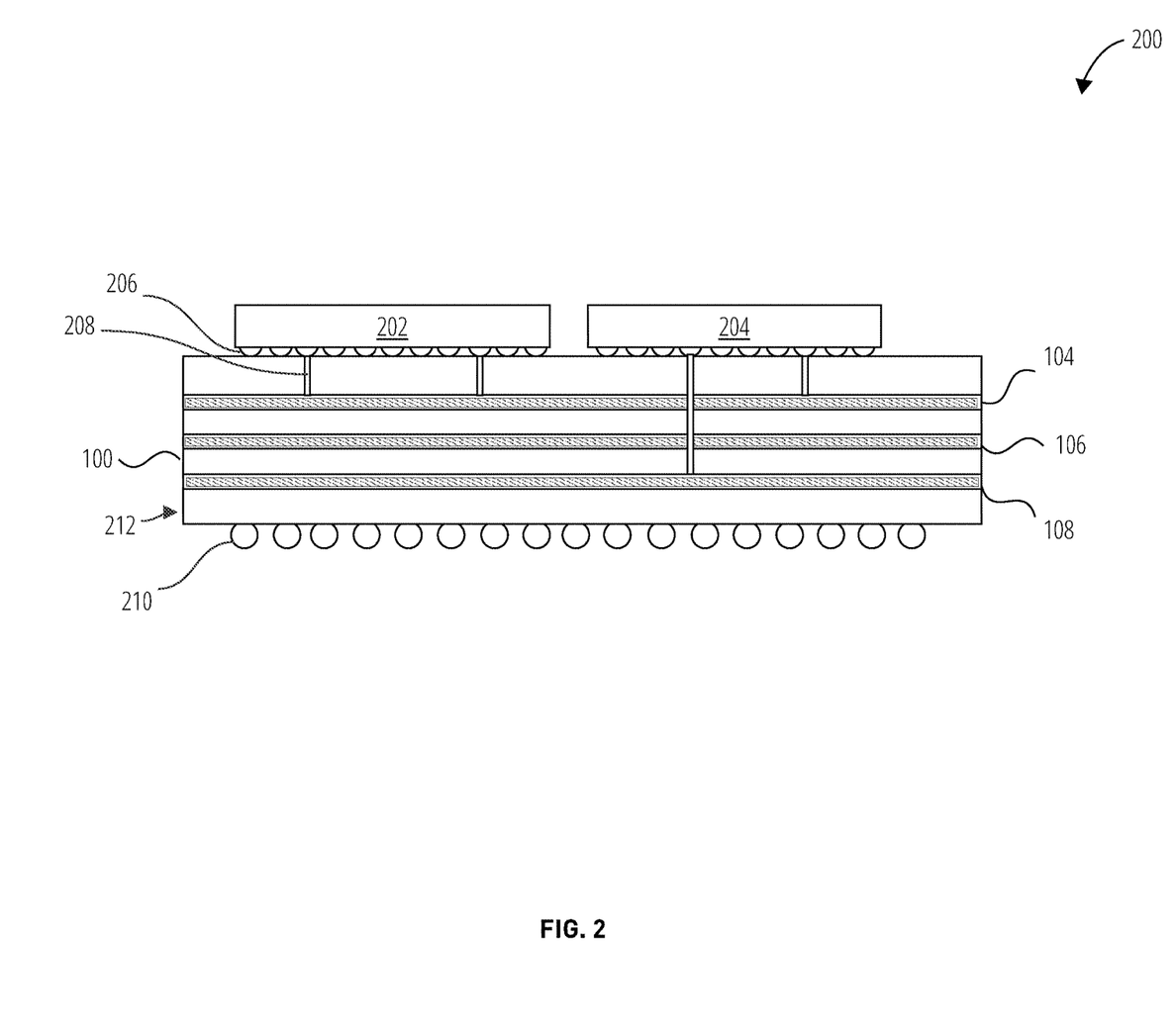
FIG. 2 illustrates a die package 200 in accordance with one embodiment.

FIG. 2 illustrates a die package 200 in accordance with one embodiment. A typical die package 200 may comprise a package substrate 100 with one or more dies mounted (e.g., soldered) on its surface. In the die package 200 these dies are depicted as die 202 and die 204. The dies are electrically coupled to the package substrate 212 using pins 206, which may typically be embodied by metallic or otherwise conductive micro-bumps. Collectively, the pins 206 form the pinout of the die 202.

Vias are typically used to route electrical signals, including power, from within the package substrate 212 to pads contacting the pins 206. For example via 208 connects a pin on die 202 to power plane 104. Other vias are depicted connecting a second pin on die 202 to the power plane 104 and a first pin on die 204 to the power plane 104 and a second pin on die 204 to power plane 108. Additional vias that may be utilized between the dies and the package substrate 212 are not depicted. At least one via may be used per die to connect to the appropriate power plane on the package substrate 212, but multiple vias and multiple power pins may also be used if the die utilizes multiple power domains or if the current requirements of the die exceed the capacity of a single via or pin.

Opposite the side of the package substrate 212 on which dies are mounted, the package substrate 212 may comprise a means of connecting to another printed circuit board (PCB) or to other electronic circuitry. This may be embodied by a set of pins that comprise a die package pinout 210. In some cases, the package substrate 212 may utilize a cable for some of the die package pinout 210 (but typically not pins for providing and distributing power). PCB or device designers may be provided information indicating which signals from the die route to each of the pins of the die package pinout 210 and may design their circuitry to interface with the appropriate pins of the die package pinout 210 to integrate the die package 200 with the other electronic circuitry.

Figure 3:
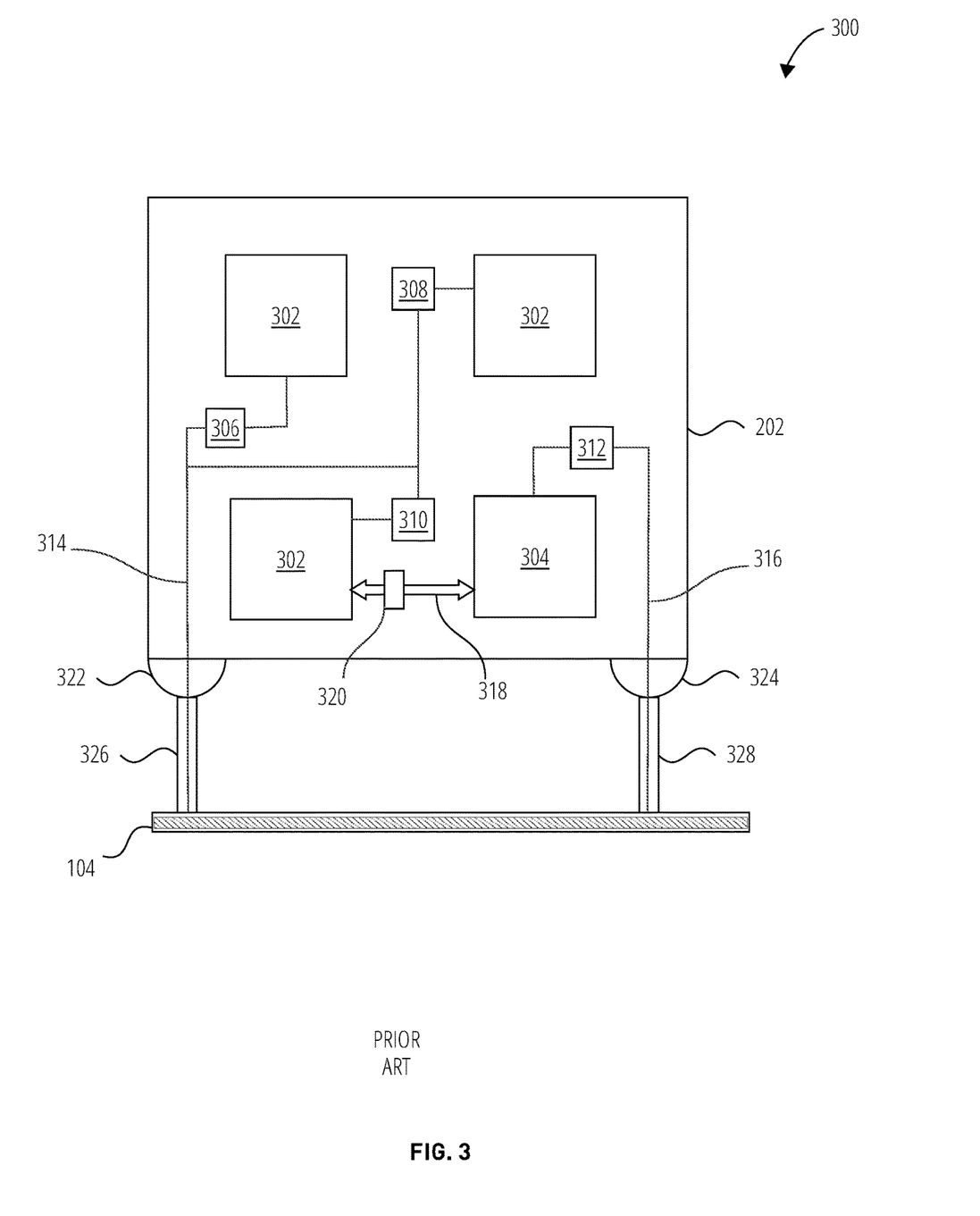
FIG. 3 illustrates a die 300 with internal power gating in accordance with one embodiment.

FIG. 3 illustrates a conventional die 300 with internal power gating. The die 300 comprises the die 202 illustrated in FIG. 2, having two separate power domains: power domain 302 and power domain 304, receiving power through power rail 314 and power rail 316, respectively. The power rails may be electronically connected to one or more of the pins 206 (pins that provide power to a die are referred to herein as 'power pins') through which the die makes electrical connection to the package substrate 212. In turn, these power pins may be connected to the power planes within the package substrate 212 by the vias. In the depicted die 202, the power rail 314 connects to the power plane 104 through the power pin 322 and the via 326. The power rail 316 connects to the power plane 104 through the power pin 324 and the via 328.

Four logic blocks are depicted, three of which operate using power domain 302 and one of which operates using power domain 304. In conventional die utilizing internal power gates, each of these logic blocks may have a power gate selectively operable to disconnect the logic block from its power rail. In the exemplary die 300 depicted, these are power gate 306, power gate 308, power gate 310, and power gate 312. To remove a logic block from drawing power, its corresponding power gate is opened using an electrical signal applied to the gate terminal of the power gate. However, the power gate itself remains coupled to the power rail, taking up area on the die and drawing leakage current.

The power gate may produce other undesirable parasitic effects in the die circuitry as well, such as parasitic capacitance or fields.

Should an interlink 318 exist between two logic blocks, one that is powered down and another that is not, a semiconductor isolation gate 320 may be provided to isolate the unpowered logic block and prevent it from causing the powered logic block to malfunction. This semiconductor isolation gate 320 may also draw leakage current, take up area, and cause other undesirable effects in the die circuitry.

Figure 4:
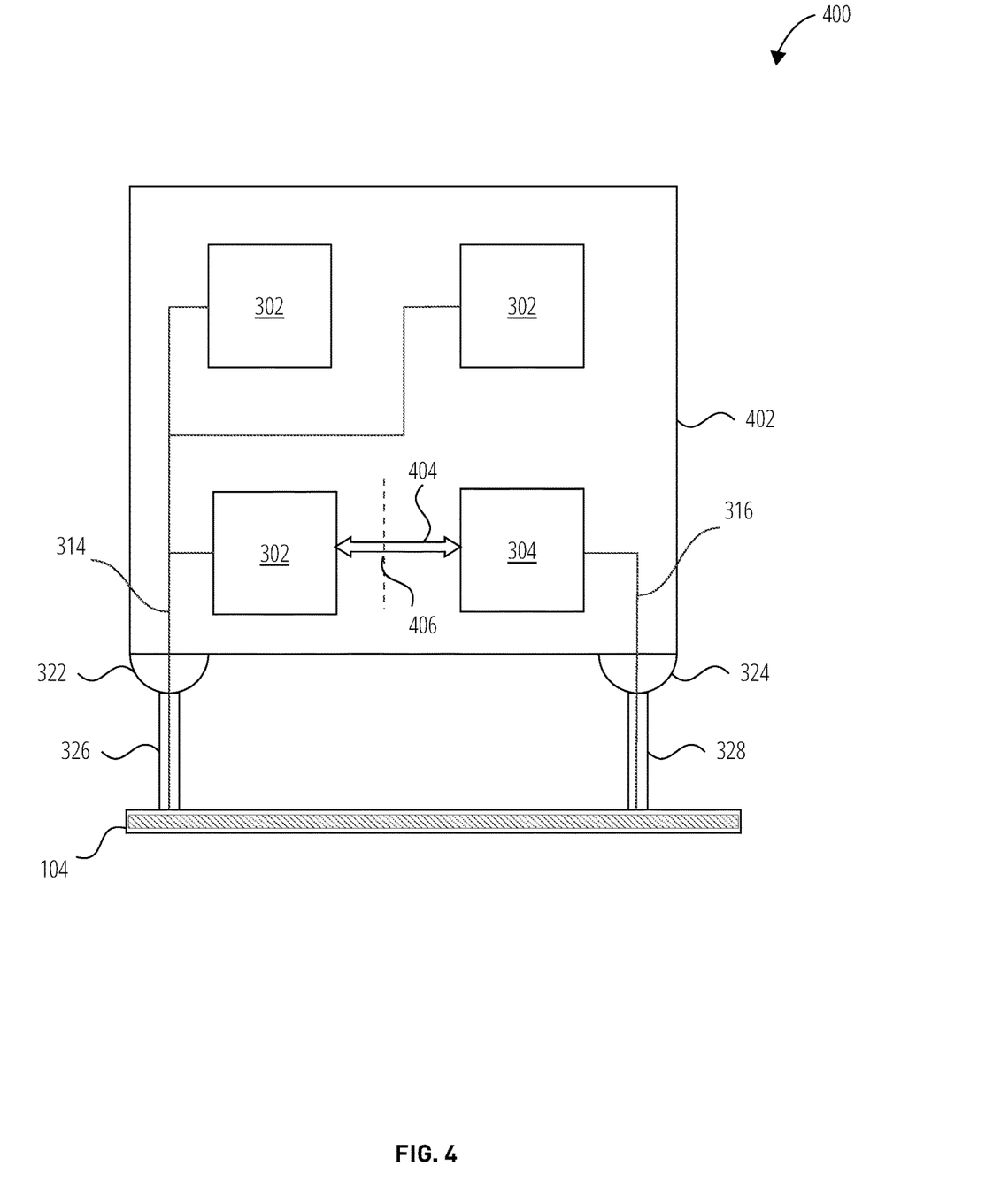
FIG. 4 illustrates a die 400 without internal power gating in accordance with one embodiment.

FIG. 4 illustrates a die 400 without internal intervening power gating between the power pins and the logic block power domains, in accordance with one embodiment. The die 400 comprises the same power domains, power rails, pins, and power plane depicted in FIG. 3. However, power gates between the power pins (power pin 322 and power pin 324) and the logic blocks (power domain 302, power domain 304) are not utilized on the die 402, and the interlink 404 between power domains provides logical isolation 406 instead of using the semiconductor isolation gate 320. This reduces the overhead die area and leakage power consumption associated with the isolation gates of the die 300.

Figure 5:
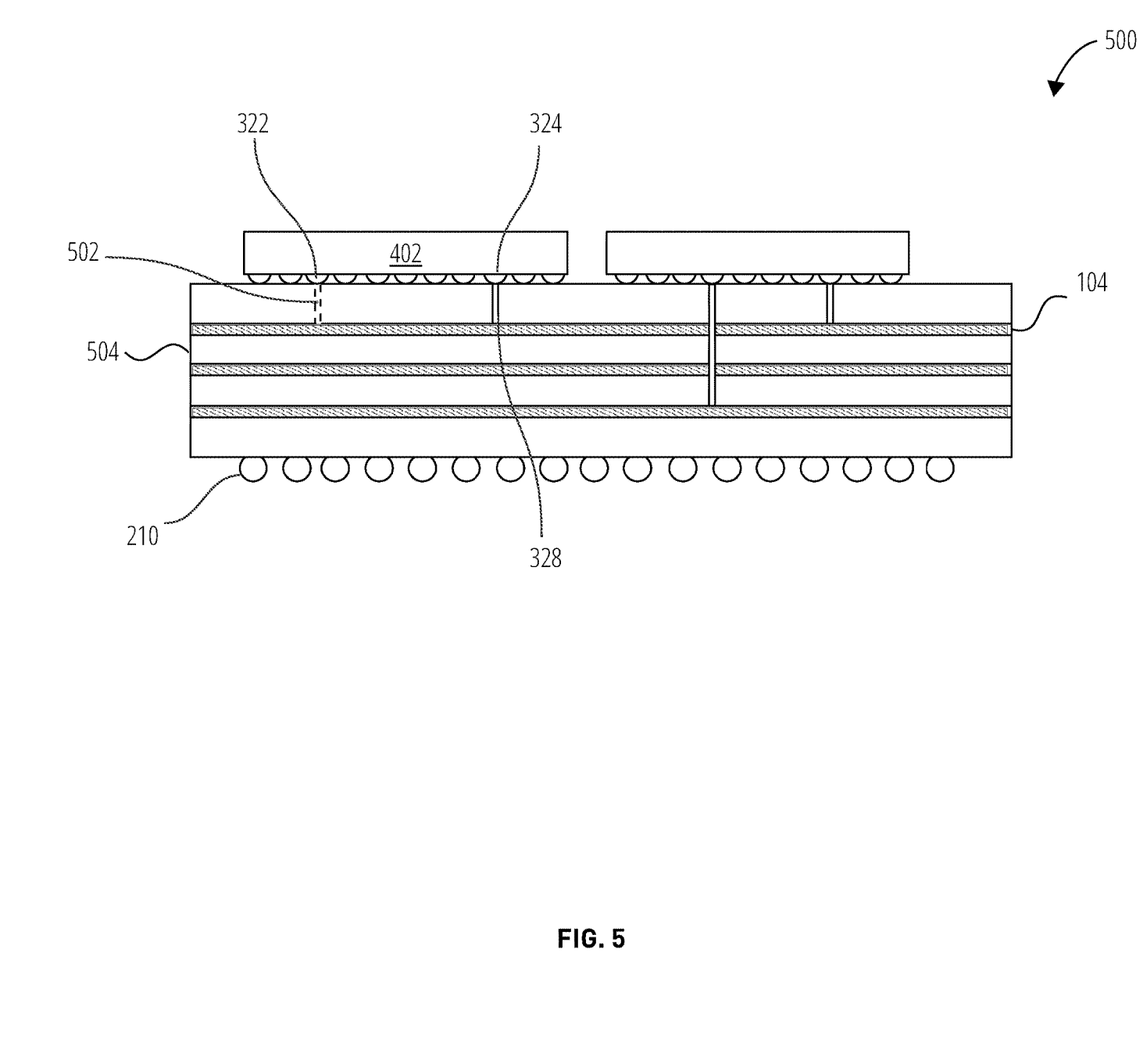
FIG. 5 illustrates a die package 500 for use with die lacking some or any internal power gating, in accordance with one embodiment.

FIG. 5 illustrates a die package 500 for use with dies lacking some or any internal intervening power gating, in accordance with one embodiment. In this embodiment, a single package substrate is coextensive in length and width (coplanar dimensions) with a plurality of dies.

Die 402 is coupled to the power plane 104 through two vias, as shown. In order to de-activate the power domain 302 the via connecting power domain 302 to power plane 104 is omitted/excluded during manufacturing, or broken/opened after being formed.

Because of the eliminated via 502 in the package substrate 504, the power pin 322 is no longer functionally coupled to the power plane 104. Thus, the power rail 314 is no longer powered, and the power domain 302 will not be activated during use of the die package 500.

Note that the die package pinout 210 need not be modified even though the power pin 322 of the die 402 is non-functional due to the eliminated via 502. The pinout of the die 402 is also not modified. The die package pinout 210 may include pins functionally corresponding to the power pins of the one or more dies of the die package, including any power pins for which corresponding vias are omitted or open in the package substrate. The die package 500 may thus be utilized without alteration of the interface between the die package 500 and a PCB or other external device.

Figure 6:
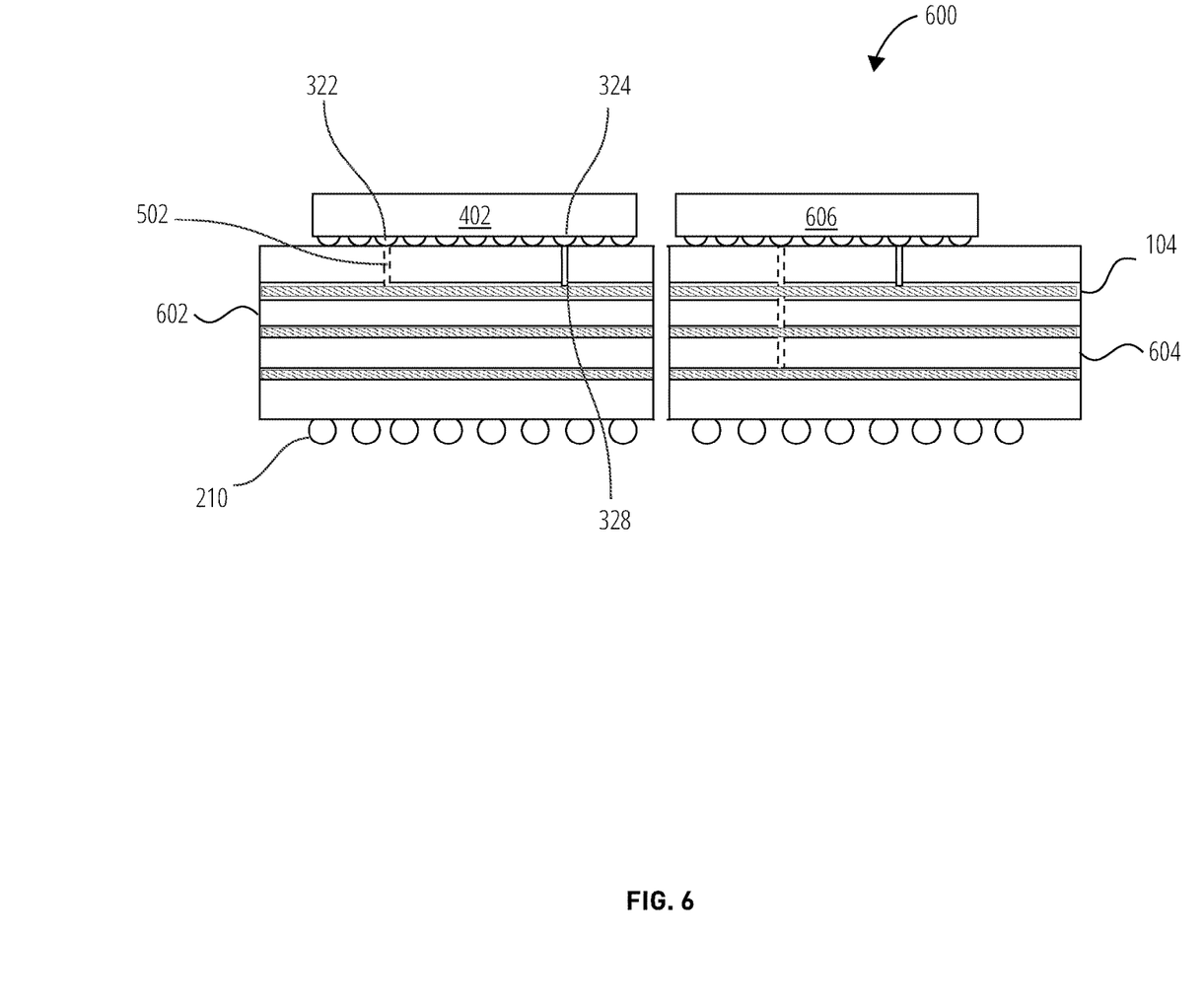
FIG. 6 illustrates a die package 600 for use with die lacking some or any internal power gating, in accordance with another embodiment.

FIG. 6 illustrates a die package 600 for use with dies lacking some or any internal power rail gating, in accordance with another embodiment. When the number of potential configurations of active power domains for a die package becomes large, it may be advantageous to manufacture distinct package substrates for each die in the die package, and assemble the combination of dies and package substrates that yields the desired power distribution to the different dies. Each distinct package substrate may be coextensive in length and width (co-planar dimensions) with the corresponding dies.

In the depiction of FIG. 6, each die or subgrouping of dies has an associated set of one or more package substrates that may be utilized with it. For example die 402 has package substrate 602 and die 606 has package substrate 604. Each of the dies may be powered individually via the die package pinout 210.

Utilizing a particular package substrate configures a die with a particular set of active and inactive (unpowered) logic blocks. Effectively, the choice of package substrates for the individual die in a die package determines which logic blocks in the die package are operational.

Figure 7:
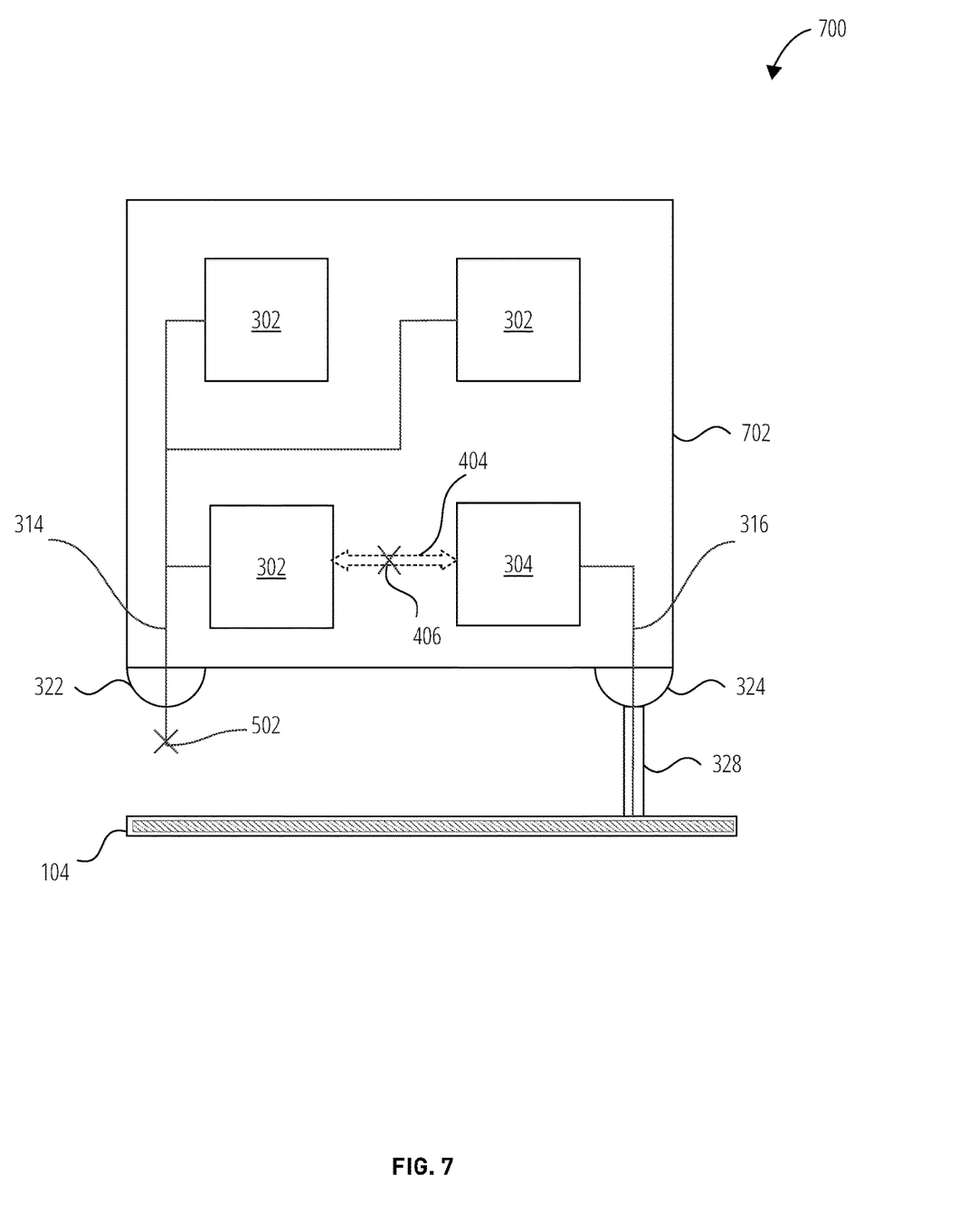
FIG. 7 illustrates a die 700 without internal power gating, in accordance with another embodiment.

FIG. 7 illustrates a die 700 without internal power gating, in accordance with another embodiment. In die 702, the power domain 302 is disconnected using the external power gating techniques disclosed herein.

Because of the eliminated via 502, power pin 322 no longer connects to power plane 104. Therefore the power domain 302 receives no power from the power plane 104. Interaction between the power domain 302 and the power domain 304 is achieved by logical isolation 406 of interlink 404. In some embodiments the isolation between the power domain 302 and the power domain 304 may utilize a physical isolation gate. However, the use of logical isolation 406, where practical, decreases the area on the die and the drawing any leakage current that a physical isolation gate would incur.

Terms used herein should be accorded their ordinary meaning in the relevant arts, or the meaning indicated by their use in context, but if an express definition is provided, that meaning controls.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

"Logic" refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A die package comprising:
    a die comprising a first power pin supplying a first power domain on the die and a second power pin supplying a second power domain on the die, the first power domain and the second power domain isolated from one another;
    the first power pin coupled to the first power domain without an intervening power gate; and
    a package substrate for the die comprising a power plane wherein a via from the power plane to the first power pin is excluded.

2. The die package of claim 1, further comprising:
    the second power pin coupled to the second power domain without the intervening power gate; and
    the package substrate comprising a via from the power plane to the second power pin.

3. The die package of claim 1, wherein the first power pin and the second power pin are soldered to the package substrate.

4. The die package of claim 1, wherein an isolation between the first power domain and the second power domain is a logical isolation.

5. The die package of claim 1, wherein an isolation between the first power domain and the second power domain is physical isolation gate.

6. The die package of claim 1, further comprising a pinout including pins corresponding to the first power pin and the second power pin.

7. The die package of claim 1, wherein the package substrate is coextensive with the die.

8. A die package comprising:
at least one die comprising:
a plurality of power pins supplying a plurality of power domains on the at least one die; and
one or more of the power pins coupled to the plurality of power domains without intervening power gates;
at least one package substrate for the at least one die, the package substrate comprising one or more power planes;
the power pins electrically engaging the at least one package substrate; and
wherein at least one via from the one or more power planes to the power pins is excluded.

9. The die package of claim 8, comprising logical isolation between the power domains.

10. The die package of claim 8, comprising a plurality of dies each coupled to a distinct coextensive package substrate.

11. The die package of claim 8, comprising a single package substrate coextensive with a plurality of dies.

12. The die package of claim 8, wherein a pinout for the at least one package substrate comprises one or more pins functionally corresponding to the plurality of power pins.

13. A die package comprising:
a plurality of dies, at least one of the plurality of dies comprising:
a plurality power pins supplying a plurality of power domains on the at least one of the plurality of dies; and
one or more of the power pins coupled to the plurality of power domains without intervening power gates;
a plurality of distinct package substrates for the plurality of dies, each of the plurality of package substrates comprising one or more power planes;
each of the plurality of dies coupled to a different one of the package substrates; and
wherein at least one package substrate is formed to specifically exclude one or more vias from one of the power planes of the at least one package substrate to power pins of a die electrically coupled to the at least one package substrate.

14. The die package of claim 13, further comprising one or more pins on a pinout of the die package functionally corresponding to the power pins of the at least one of the plurality of dies corresponding to the excluded vias.

15. The die package of claim 13, the at least one of the plurality of dies comprising the power pins coupled to the plurality of power domains without the intervening power gates further comprising one or more physical isolation gates between the power domains.

16. The die package of claim 13, the at least one of the plurality of dies comprising the power pins coupled to the plurality of power domains without the intervening power gates further comprising logical isolation between the power domains.

17. The die package of claim 13, wherein power pins corresponding to the excluded vias are soldered to the package substrates.

18. The die package of claim 13, wherein the excluded vias are excluded when the package substrates are manufactured.

* * * * *